US 6,658,523 B2

(12) United States Patent
Janzen et al.

(10) Patent No.: US 6,658,523 B2
(45) Date of Patent: Dec. 2, 2003

(54) SYSTEM LATENCY LEVELIZATION FOR READ DATA

(75) Inventors: Jeffery W. Janzen, Meridian, ID (US); Brent Keeth, Boise, ID (US); Kevin J. Ryan, Eagle, ID (US); Troy A. Manning, Meridian, ID (US); Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 09/804,221

(22) Filed: Mar. 13, 2001

(65) Prior Publication Data

US 2002/0133666 A1 Sep. 19, 2002

(51) Int. Cl.⁷ ............................................... G06F 12/00
(52) U.S. Cl. ........................... 711/105; 711/5; 711/167; 711/169; 711/170; 365/194
(58) Field of Search ................................. 711/105, 167, 711/170, 5, 169; 365/194

(56) References Cited

U.S. PATENT DOCUMENTS

| 5,778,446 A | * | 7/1998 | Kim | 711/167 |
| 5,890,195 A | * | 3/1999 | Rao | 711/105 |
| 5,917,760 A |   | 6/1999 | Millar | |
| 5,987,244 A | * | 11/1999 | Kau et al. | 713/500 |
| 6,125,421 A | * | 9/2000 | Roy | 711/5 |
| 6,154,821 A |   | 11/2000 | Barth et al. | |
| 6,182,112 B1 | * | 1/2001 | Malek et al. | 709/201 |
| 6,442,644 B1 | * | 8/2002 | Gustavson et al. | 711/105 |
| 6,445,624 B1 | * | 9/2002 | Janzen et al. | 365/191 |

FOREIGN PATENT DOCUMENTS

| EP | 0 852 380 A2 | 7/1998 |
| EP | 0 852 380 A3 | 9/1999 |
| WO | WO 99/19876 | 4/1999 |

* cited by examiner

*Primary Examiner*—Donald Sparks
(74) *Attorney, Agent, or Firm*—Dickstein Shapiro Morin & Oshinsky LLP (57) ABSTRACT

In a high speed memory subsystem differences in each memory device's minimum device read latency and differences in signal propagation time between the memory device and the memory controller can result in widely varying system read latencies. The present invention equalizes the system read latencies of every memory device in a high speed memory system by comparing the differences in system read latencies of each device and then operating each memory device with a device system read latency which causes every device to exhibit the same system read latency.

37 Claims, 7 Drawing Sheets

| DEVICE READ LATENCY | CFG2 | CFG1 | CFG0 |
|---|---|---|---|
| MINIMUM DEVICE READ LATENCY | 0 | 0 | 0 |
| MINIMUM DEVICE READ LATENCY + 1 CLOCK CYCLE | 0 | 0 | 1 |
| MINIMUM DEVICE READ LATENCY + 2 CLOCK CYCLES | 0 | 1 | 0 |
| MINIMUM DEVICE READ LATENCY + 3 CLOCK CYCLES | 0 | 1 | 1 |
| MINIMUM DEVICE READ LATENCY + 4 CLOCK CYCLES | 1 | 0 | 0 |
| MINIMUM DEVICE READ LATENCY + 5 CLOCK CYCLES | 1 | 0 | 1 |
| MINIMUM DEVICE READ LATENCY + 6 CLOCK CYCLES | 1 | 1 | 0 |
| MINIMUM DEVICE READ LATENCY + 7 CLOCK CYCLES | 1 | 1 | 1 |

FIG. 5

SYSTEM LATENCY LEVELIZATION FOR READ DATA

FIELD OF THE INVENTION

The present invention relates generally to high speed synchronous memory systems, and more particularly to setting read latencies of memory devices so that read data from any memory device arrives at the memory controller at the same time.

BACKGROUND OF THE INVENTION

Figure 1:
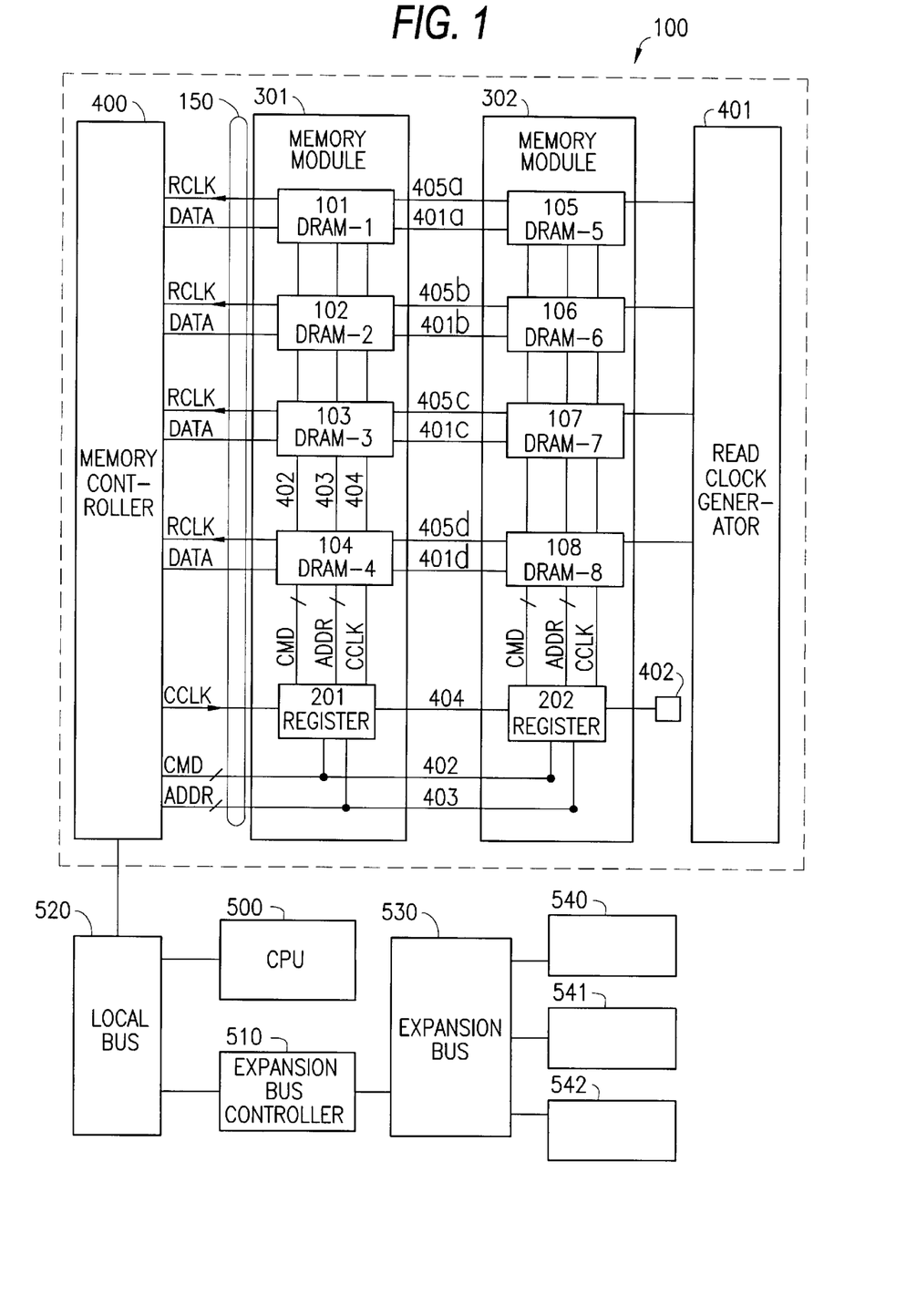
FIG. 1 is a block diagram illustrating a computer system with an high speed memory system.

An exemplary computer system is illustrated in FIG. 1. The computer system includes a processor 500, a memory subsystem 100, and an expansion bus controller 510. The memory subsystem 100 and the expansion bus controller 510 are coupled to the processor 500 via a local bus 520. The expansion bus controller 510 is also coupled to at least one expansion bus 530, to which various peripheral devices 540–542 such as mass storage devices, keyboard, mouse, graphic adapters, and multimedia adapters may be attached.

The memory subsystem 100 includes a memory controller 400 which is coupled to a plurality of memory modules 301–302 via a plurality of signal lines 401a–401d, 402, 403, 404, 405a–405d. The plurality of data signal lines 401a–401d are used by the memory controller 400 and the memory modules 301–302 to exchange data DATA. Addresses ADDR are signaled over an plurality of address signal lines 403, while commands CMD are signaled over a plurality of command signal lines 402. The memory modules 301–302 include a plurality of memory devices 101–108 and a register 201–202. Each memory device 101–108 is a high speed synchronous memory device. Although only two memory modules 301, 302 and associated signal lines 401a–401d, 402, 403, 404, 405a–405d are shown in FIG. 1, it should be noted that any number of memory modules can be used.

The plurality of signal lines 401a–401d, 402, 403, 404, 405a–405d, which couple the memory modules 301, 302 to the memory controller 400 are known as the memory bus 150. The memory bus 150 may have additional signal lines which are well known in the art, for example chip select lines, which are not illustrated for simplicity. Each row of memory devices 101–104, 105–108 which span the memory bus 150 is known as a rank of memory. Generally, single side memory modules, such as the ones illustrated in FIG. 1, contain a single rank of memory. However, double sided memory modules containing two ranks of memory may also be employed.

A plurality of data signal lines 401a–401d couple the memory devices 101–108 to the memory controller 400. Read data is output serially synchronized to the read clock signal RCLK, which is driven across a plurality of read clock signal lines 405a–405d. The read clock signal RCLK is generated by the read clock generator 401 and driven across the memory devices 101–108 of the memory modules 302, 301, to the memory controller 400. Commands and addresses are clocked using a command clock signal CCLK which is driven by the memory controller across the registers 201, 202 of the memory modules 301, 302, to a terminator 402. The command, address, and command clock signal lines 402–404 are directly coupled to the registers 201, 202 of the memory modules 301, 302. The registers 201, 202 buffer these signals before they are distributed to the memory devices 101–108 of the memory modules 301, 302. The memory subsystem 100 therefore operates under at least a read clock domain governed by the read clock RCLK and a command clock domain governed by the command clock CCLK. The memory subsystem 100 may also have additional clock domains, such as one governed by a write clock (not shown).

When a memory device 101–108 accepts a read command, a data associated with that read command is not output on the memory bus 150 until a certain amount of time has elapsed. This time is known as device read latency. A memory device 101–108 can be programmed to operate at any one of a plurality of device read latencies, ranging from a minimum device read latency (which varies from device to device) to a maximum latency period.

However, device read latency is only one portion of the read latency seen by the memory controller 400. This read latency seen by the memory controller, known as system read latency, is the sum of the device read latency and the latency caused by the effect of signal propagation time between the memory devices 101–108 and the memory controller 400. If the signal propagation between each memory device 101–108 and the memory controller 400 were identical, then the latency induced by the signal propagation time would be a constant and equally affect each memory device 101–108. However, as FIG. 1 illustrates, commands CMD, addresses ADDR, and the command clock CCLK are initially routed to registers 201, 202 before they are distributed to the memory devices 101–108. Each memory device 101–104, 105–108 on a memory module 301, 302 is located at a different distance from the register 201, 202. Thus each memory device 101–104 will receive a read command issued by the memory controller 400 at different times. Additionally, there are also differences in distance between the memory controller 400 and the registers 201, 202 of the two memory modules 301, 302. Register 201 (on memory module 301) is closer to the memory controller 400 and will therefore receive commands, addresses, and the command clock before register 202 (on memory module 302). Thus, every memory device 101–108 of the memory subsystem 100 has a different signal path length to the memory controller for its command CMD, address ADDR, and command clock CCLK signals and will receive a read command issued by the memory controller at varying times. At the high clock frequencies (e.g., 300 MHz to at least 533 MHz), these timing differences become significant because they may overlap clock cycle boundaries.

Due to differences in each memory device's 101–108 minimum device read latency and differences in their command CMD, address ADDR, and command clock CCLK signal propagation, each memory device 101–108 may have a different system read latency. Since each memory device stores only a portion of a memory word, the memory controller normally reads a plurality of memory devices in parallel. The differences in system read latencies among the memory devices 101–108 of the memory subsystem 100 makes this task difficult. Accordingly, there is a need for an apparatus and method to equalize the system read latencies of each memory device so that the memory controller can efficiently process a read transaction across multiple memory devices.

SUMMARY OF THE INVENTION

The present invention is directed at a method and apparatus for equalizing the system read latencies of each memory device in a high speed memory system. The equalization process ensures that each memory device responds to the memory controller with the same system read latency, regardless of each device's minimum device read latency and differences in signal propagation time due to differences in the memory device's physical location on the memory bus. Each memory device has a plurality of configuration lines which can be used by the memory controller to set the memory device to operate at any one of a plurality of device read latencies longer than the device's minimum device read latency. During the equalization process, each memory device is initially operated its minimum device read latency. The memory controller reads a calibration pattern to determine each memory device's system read latency. The memory controller calculates an offset which may be added to each memory device's device read latency to cause each memory device to operate at a system read latency equal to the slowest observed system read latency when each memory device is operated at its minimum device read latency. Each memory device is thereafter operated at an increased device latency, with the amount of increase equal to the offset associated with the memory device. In this manner, all memory devices in the memory system are equalized to operate with the same system read latency.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 2:
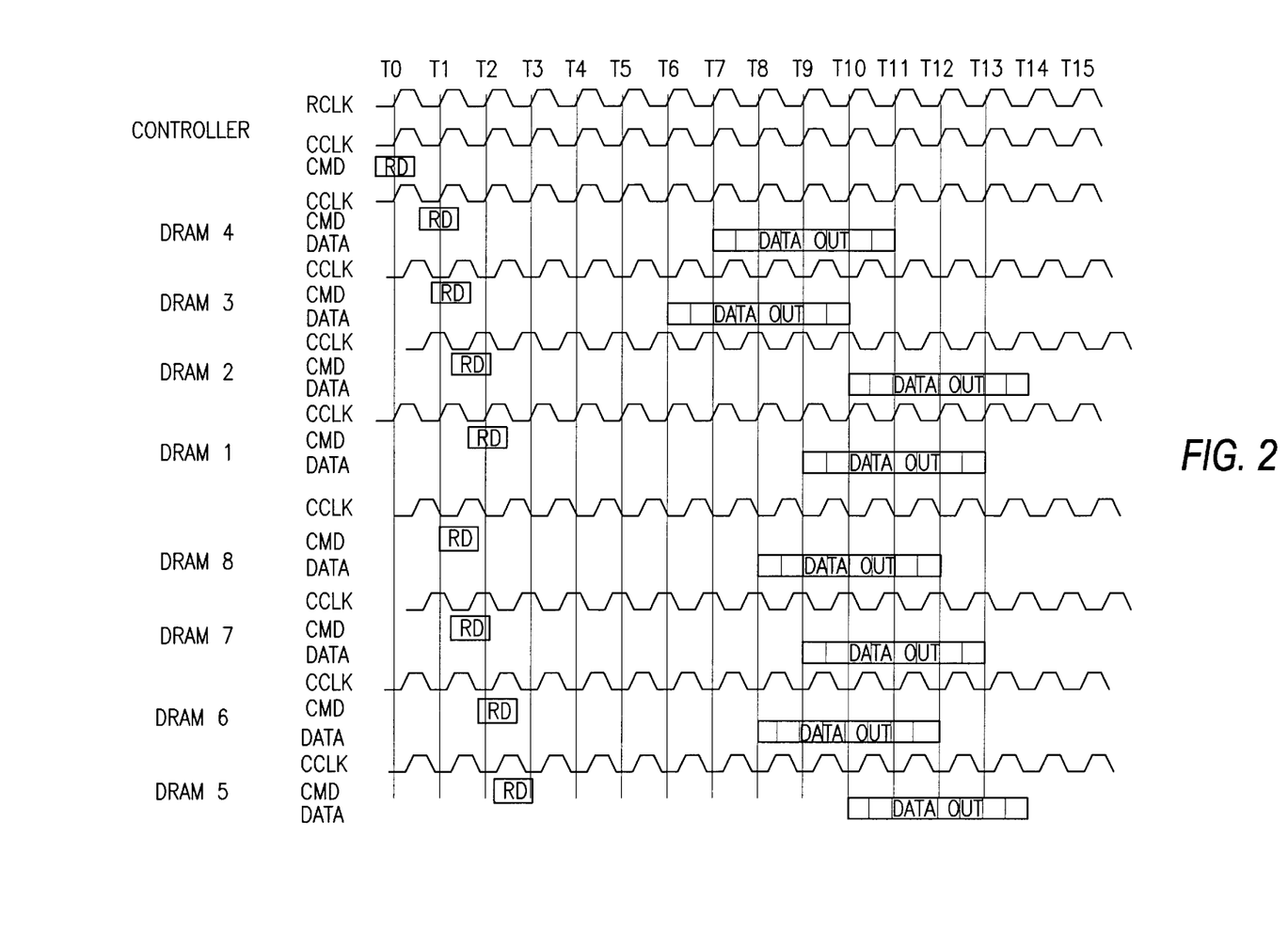
FIG. 2 is a timing diagram showing the read latencies of the plurality of memory devices which comprise the high speed memory system of FIG. 1 prior to equalization.

Now referring to the drawings, where like reference numerals designate like elements, there is shown in FIG. 2 a timing diagram of a read operation issued by the memory controller 400 to each memory device 101–108, with each memory device set to operate at its minimum device read latency. A memory device's minimum device read latency is based upon its construction and can vary from device to device. In the example illustrated in FIG. 2, the memory devices DRAM-1 101, DRAM-2 102, DRAM-3 103, and DRAM-4 104 of the memory module 301 closest to the memory controller 400 have minimum device read latencies of 7, 8, 5, and 6 clock cycles, respectively. The memory devices DRAM-5 105, DRAM-6 106, DRAM-7 107, and DRAM-8 108 of the memory module 302 furthest from the memory controller 400 have minimum device read latencies of 8, 6, 8, and 7 clock cycles respectively. Minimum device latency is measured as the number of clock cycles following the initiation of a read command RD before read data is available on the memory bus 150.

Due to differences in the length of the signal propagation path for the command CMD and command clock CCLK signals, each of the memory devices 101–108 in the memory subsystem 100 receives a read command RD issued by the memory controller 400 at varying times. FIG. 2 shows the memory controller issuing a read command centered on clock cycle T0. The memory devices 101–104 on the memory module 301 located closest to the memory controller 400 receive the read command between clock cycles T1 and T2, while the memory devices 105–108 on the memory module 302 located furthest from the memory controller receive the read command between clock cycles T1 and T3. The system read latency to each of the memory devices 101–108 is a function of both the device read latency and the signal propagation time between the memory controller 400 and the memory devices. For example, the memory devices 101–104 in the memory module 301 located closest to the memory controller 400 have system read latencies of 9, 10, 6, and 7 clock cycles, respectively. The memory devices 105–108 in the memory module 302 located furthest from the memory controller 400 have system read latencies of 10, 8, 9, and 8 clock cycles, respectively. Note that the difference in system read latencies is large enough that memory module 103 completes its data output before memory module 102 begins data output.

Figure 3A:
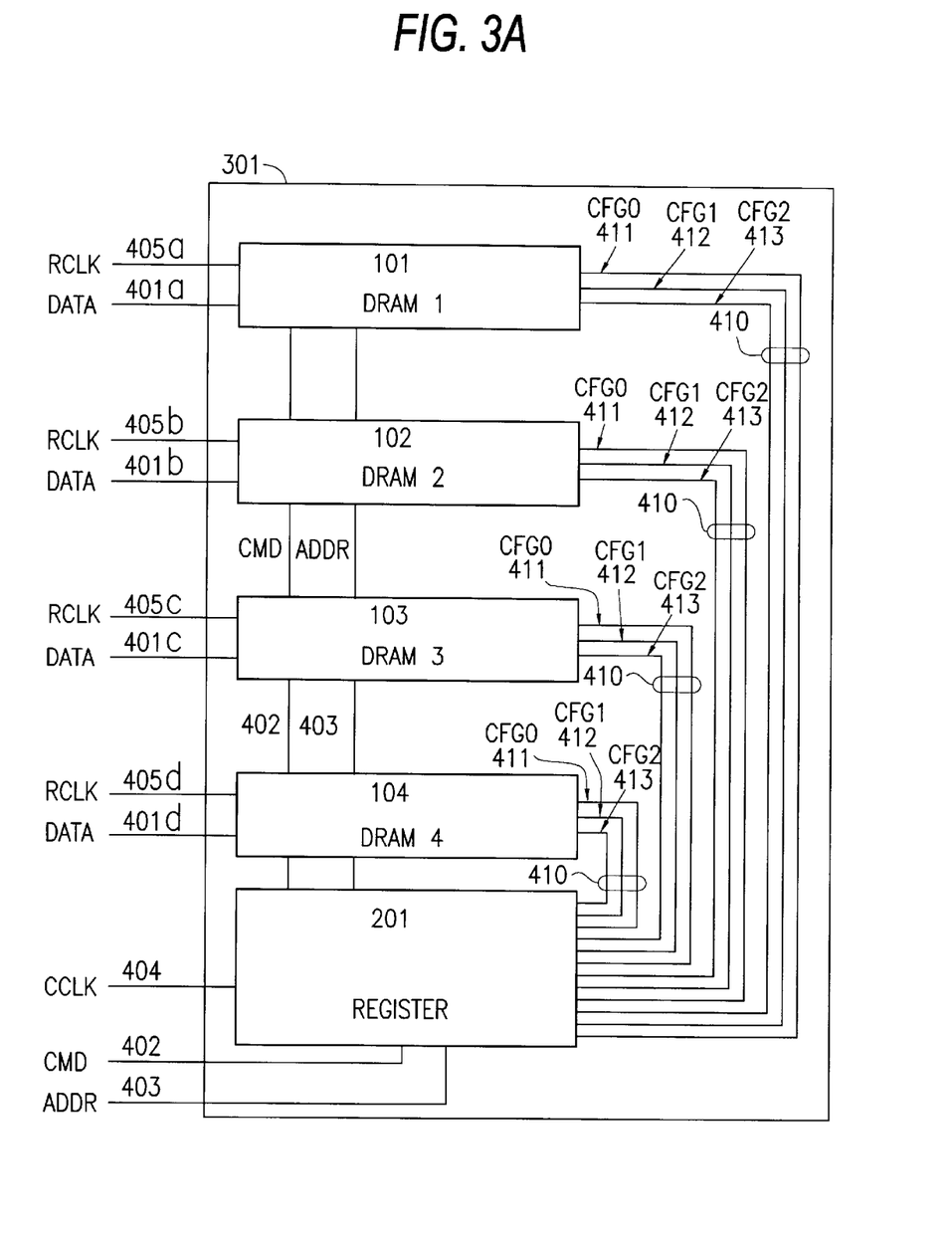
FIG. 3A is a more detailed diagram showing a memory module 301 in accordance with the present invention.

Now referring to FIG. 3A, there is shown a more detailed diagram of one of the memory modules 301 in accordance with the present invention. In addition to the read clock signal lines 405a–405d, data signal lines 401a–401d, command clock signal line 404, plurality of command signal lines 402, and plurality of address signal lines 403, each memory device 101–104 is also coupled to the register 201 via a plurality of configuration lines 410. (These pluralities of configuration lines 410 were not illustrated in FIG. 1 in order to avoid cluttering that diagram.) In the exemplary embodiment each plurality of configuration lines 410 each include at least 3 configuration signal lines 411–413 carrying configuration signals CFG0, CFG1, and CFG2, respectively. For each memory device, the memory controller 400 can set the states of the configuration lines 411–413 by sending commands CMD and addresses ADDR into register 201.

Figure 3B:
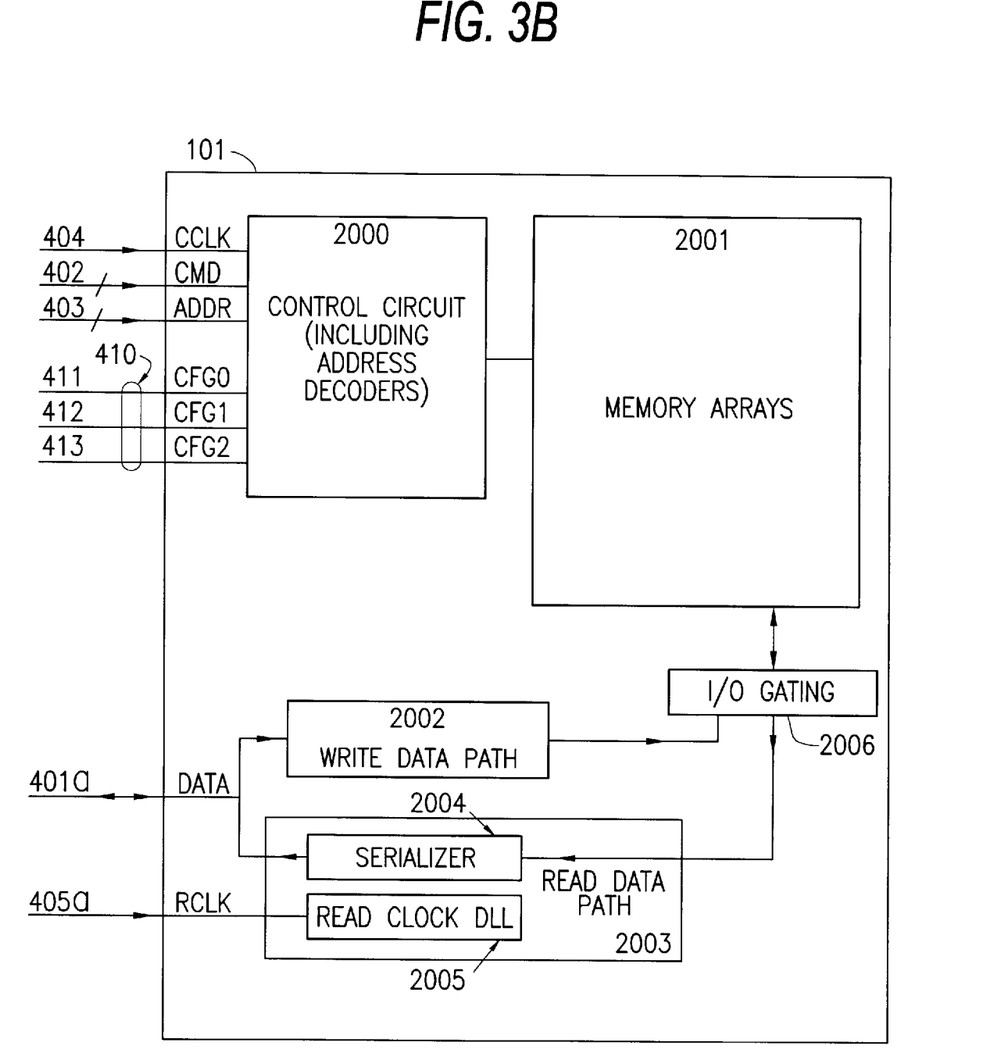
FIG. 3B is a more detailed diagram showing one of the memory devices of the memory module illustrated in FIG. 3A.

FIG. 3B is a more detailed diagram of one of the memory devices 101 shown in FIG. 3A. Suitable memory devices include any type of high speed DRAM. Thus, the principles of the present invention may be incorporated into any type of single or double data rate synchronous memory device, or Advance DRAM Technology (ADT) memory devices. The memory device 101 includes a control circuit (including address decoders) 2000 coupled to a plurality of signal lines, including the command clock signal line 404, a plurality of command signal lines 402, a plurality of address signal lines 403, and the plurality of configuration lines 410. The memory device 101 also includes a write data path 2002 and a read data path 2003 both of which are coupled to the data signal line 401a and the plurality of memory arrays 2001 (via I/O Gating circuit 2006). The read data path is coupled to the read clock signal line 405a via a read clock delay lock loop (DLL), which is used to synchronize read data output with the read clock. The read data path also includes a serializer 2004, which converts the parallel data read from the plurality of memory arrays 2001 into the serial data output on the data signal line 401a in synchronism with the read clock signal RCLK.

Figure 4:
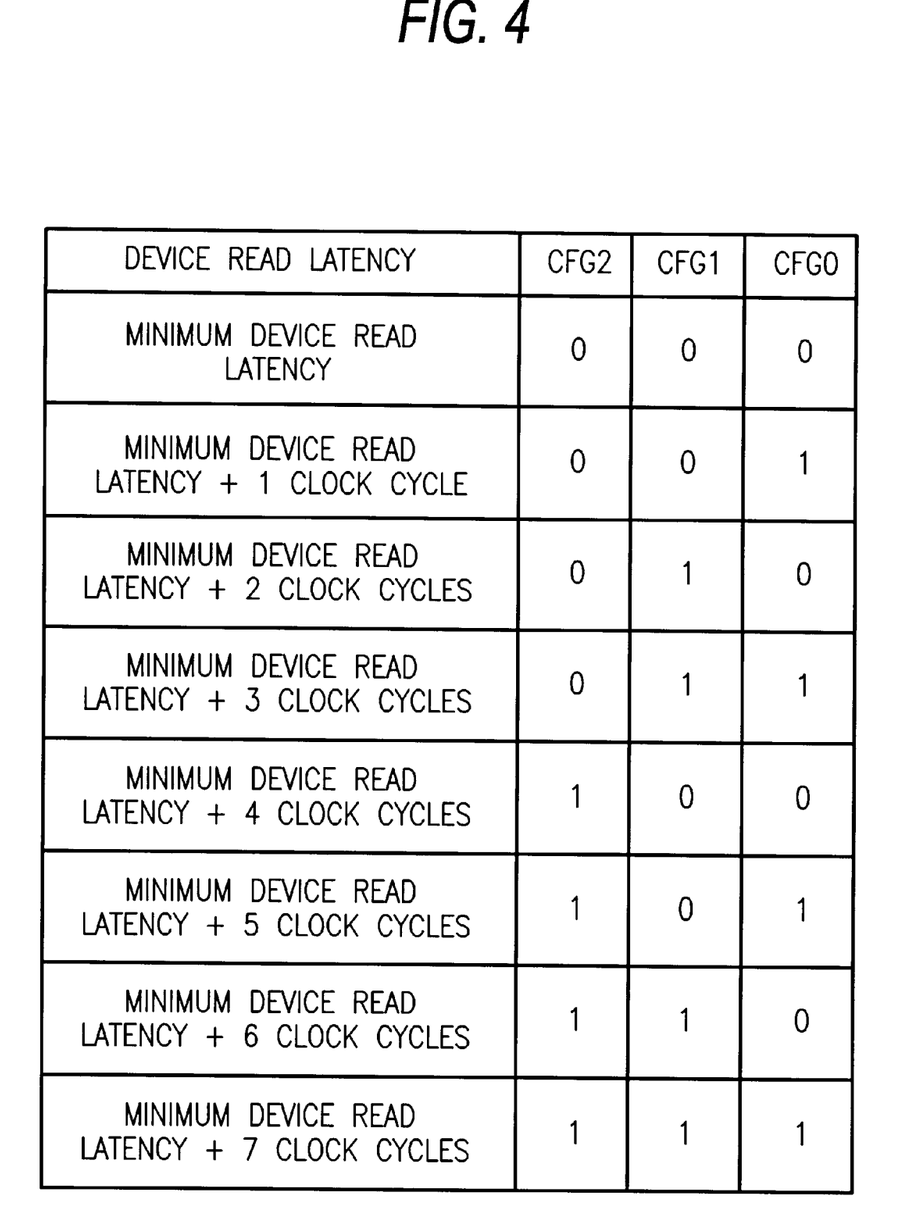
FIG. 4 is a diagram showing the relationship between a memory device's device read latency and the states of the configuration lines.

The memory devices DRAM-1 101–DRAM-4 104 are wired to respond to the different states of the configuration lines 411–413 to thereby operate at different selectable device read latencies. FIG. 4 shows how a memory device 101–104 can be made to operate across an 8-cycle variation in device read latency, ranging from the minimum device read latency to the minimum device read latency plus 7 clock cycles. In alternate embodiments there may be more or less configuration lines with a corresponding change in the number of permitted device latencies. Alternatively, there may be additional configuration lines directed towards memory functions not related to device read latency. For example, an additional configuration line can be used to enable or disable the read clock DLL 2005.

The states of each of the plurality of configuration lines 410 can be set by the memory controller 400. For example, the memory controller may include a command which causes the register 201, 202 of the memory module 301, 302 to assert a state on the plurality of configuration lines 410 corresponding to an address asserted on the plurality of address signal lines 403. Thus the memory controller 400 is capable of changing a memory device's 101–108 device read latency, and therefore also the memory device's system read latency by varying the states of the configuration lines 411–413.

Figure 5:
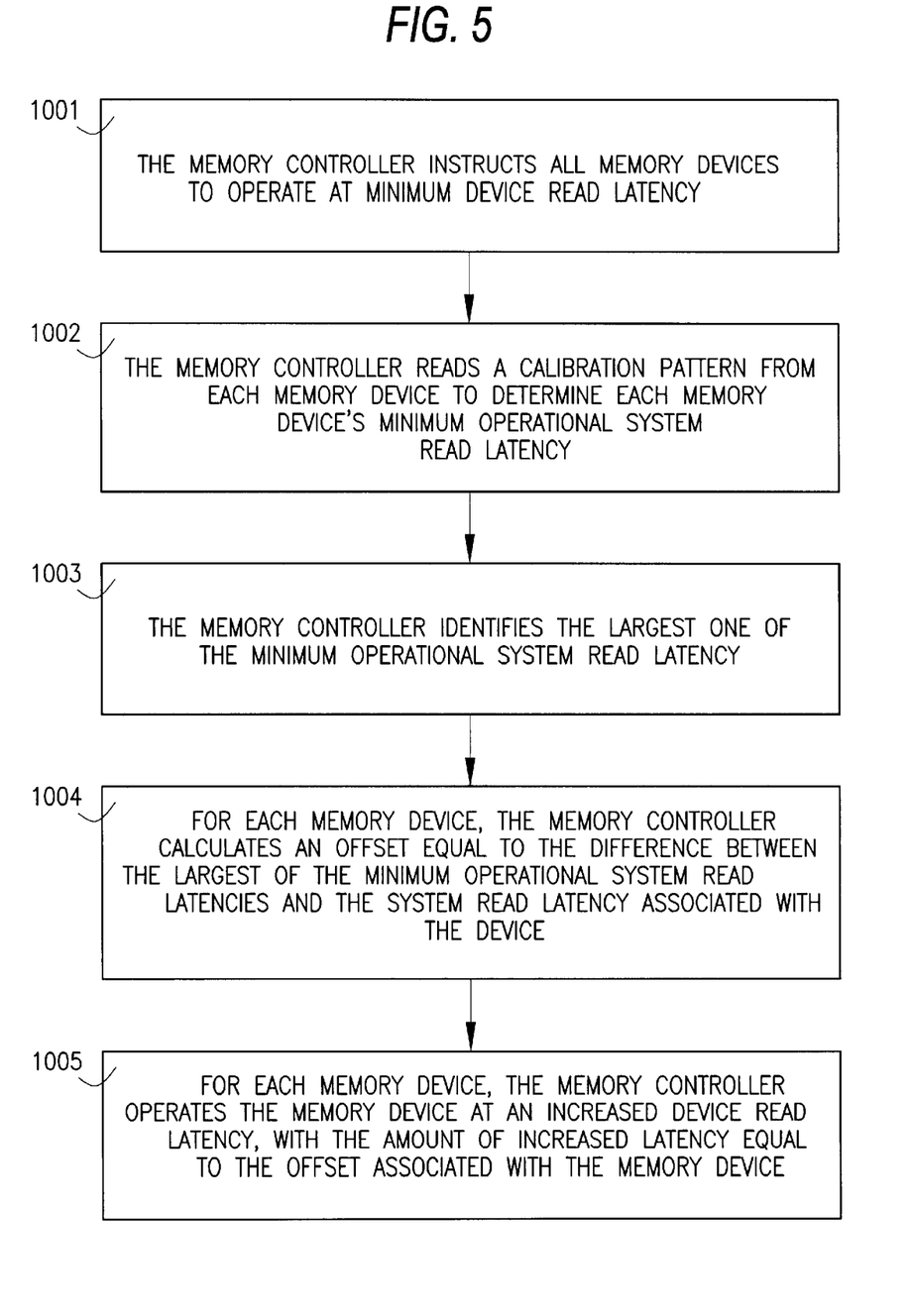
FIG. 5 is a flow chart showing how the memory controller equalizes system read latencies across the memory devices of the memory system.
Figure 6:
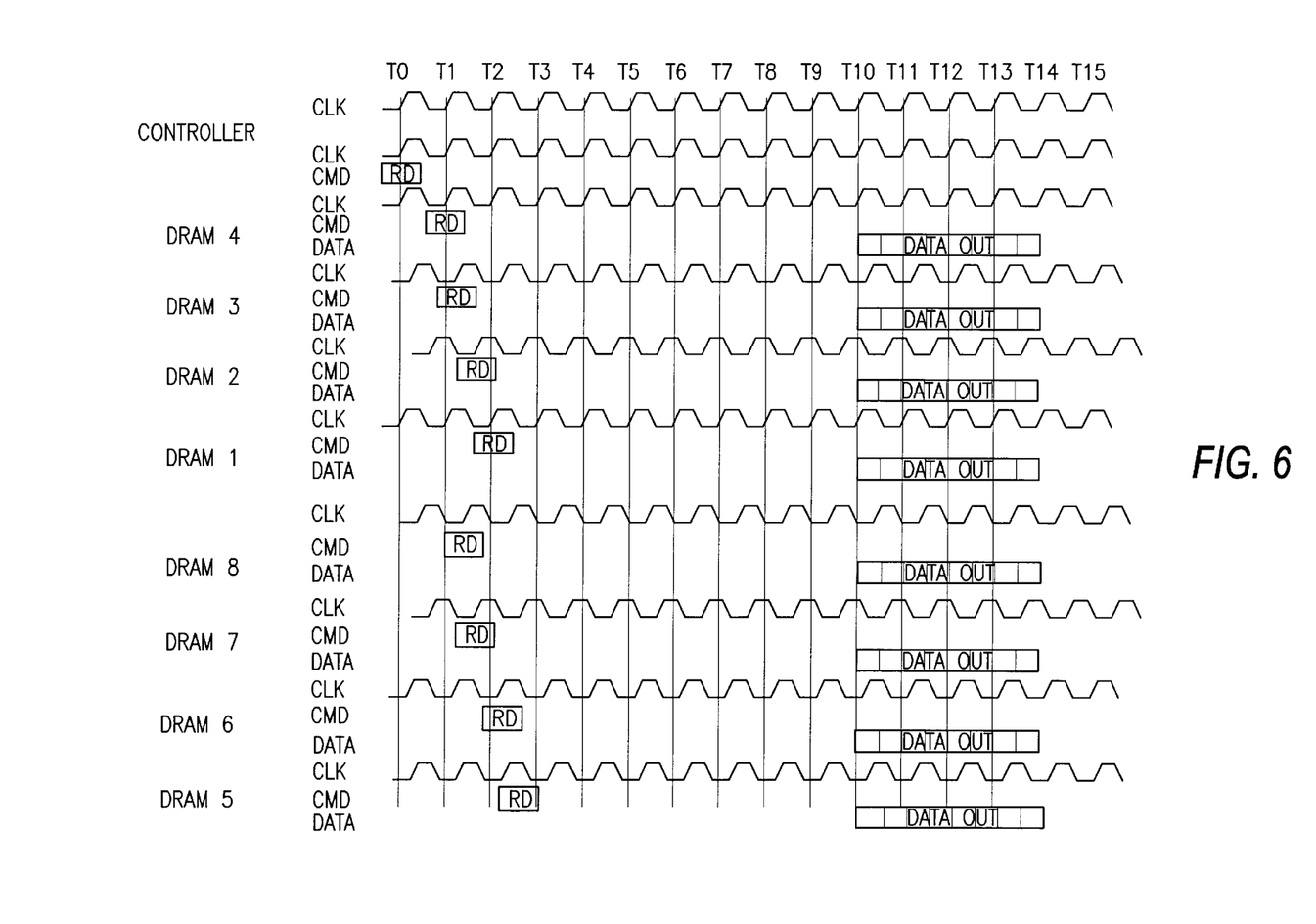
FIG. 6 is a is a timing diagram showing the read latencies of the plurality of memory devices which comprise the high speed memory system after equalization.

The memory controller 400 uses the plurality of configuration lines 410 to equalize the system read latencies across all memory devices 101–108 of the memory subsystem 100. Referring to FIG. 5, the process begins at step 1001 with the memory controller 400 instructing all memory devices 101–108 to operate at their minimum device read latencies. The memory controller 400 can instruct the memory devices to operate at minimum device read latency by asserting the appropriate command CMD and address ADDR signals on the plurality of command signal lines 402 and the plurality of address signal lines 403, respectively, thereby causing a specific state of the configuration lines CFG0, CFG1, CFG2 to be set. As shown in FIG. 4, the state of the configuration lines CFG0, CFG1, CFG2 cause the memory devices 101–108 to operate a specific latencies. Thus, one aspect of the invention is that the device read latency of each memory device is specified using relative numbers. This is in contrast to prior art memory systems, which specific latencies as actual clock cycles, thereby requiring a memory controller to be aware of the minimum device read latency for each memory device. For example, if a device has a minimum device read latency of 2 clock cycles, a prior art memory controller would need to know that 2 clock cycles corresponded to the minimum device read latency because in order to program the device to operate at its minimum device read latency, the memory controller would need to program the latency value by using the actual number of clock cycles, which in this case would be 2 clock cycles. In the present invention, however, the memory controller 400 does not need to know the minimum device read latency for each memory device 101–108 because read latencies are specified as offsets from the minimum read latency.

At step 1002, the memory controller reads a calibration pattern from each memory device 101–108, noting the minimum operational system read latency for each memory device 101–108. The calibration pattern is formatted to permit the memory controller to easily identify when data first arrives at the memory controller. In the exemplary embodiment each memory device 101–108 returns 8-bits of data per read command, the data being serially driven across the data signal lines 401*a*–401*d* to the memory controller 400. A good calibration pattern would permit the memory controller to easily recognize when the first bit of data arrives at the memory controller. In the exemplary embodiment, the preferred calibration pattern is a byte in which the first bit which arrives at the memory controller is set to one state the remaining bits are set to a different state. Thus (binary) 01111111 or (binary) 10000000 would be preferred calibration patterns.

At step 1003, the memory controller 400 determines the largest value of the set of minimum operational system read latency. At step 1004, for each memory device 101–108, the memory controller 400 computes an offset equal to the difference between that memory device's system read latency and the largest value of the set of minimum operational system read latencies. At step 1005, the memory controller 400 instructs that memory device to operate with an increased device read latency. The amount of increased latency is equal to the offset and is controlled by the state of the signals asserted on the memory device's plurality of configuration lines 410.

For example, FIG. 2 showed a memory system having 8 memory devices DRAM-1 101–DRAM-8 108 with system read latencies of 9, 10, 6, 7, 10, 8, 9, and 8 clock cycles respectively. The largest observed system read latency is 10 clock cycles. The offsets for the memory devices 101–108 is equal to the difference between the largest observed system read latency, which in this example is 10 clock cycles, and the system read latency of each memory device. In this example, the offsets for memory devices 101–108 are equal to 1, 0, 4, 3, 0, 2, 1, and 2, respectively. Thus the memory controller 400 would operate memory device 101 at an increased device read latency of one 1 cycle, while memory device 102 would be operated at an increased device read latency of 0 clock cycle (i.e., equal to the minimum device read latency). FIG. 3 illustrates that the end result of this process is a memory system in which each memory device 101–108 has an equal system read latency. As a consequence, when read commands are issued to memory devices DRAM-1 101-DRAM-8 108, the memory controller will see the read data from all memory device of all memory modules at substantially the same time.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A memory device comprising:

a memory array;

a control circuit coupled to the memory array;

at least one configuration line coupled to said control circuit;

wherein said control circuit operates the memory device at a device read latency equal to a minimum device read latency of said memory device plus a number of clock cycles, said number being based upon a state of a signal asserted on at least one configuration line.

2. The memory device of claim 1, wherein the control circuit, responsive to a command issued by an external memory controller, outputs to said memory controller a calibration pattern as read data.

3. The memory device of claim 2, wherein said calibration pattern includes at least two successive bits which have a different logic state.

4. The memory device of claim 3, wherein said calibration pattern has its first bit set to a binary 0 and all subsequent bits set to a binary 1.

5. The memory device of claim 3, wherein said calibration pattern has its first bit set to a binary 1 and all subsequent bits set to a binary 0.

6. The memory device of claim 1, wherein said at least one configuration line includes a plurality of configuration lines.

7. The memory device of claim 1, wherein said control circuit operates said memory device over a set of device read latencies, said set including N device read latencies ranging from the minimum device read latency to a number of clock cycles equal to N−1 clock cycles greater than the device minimum read latency.

8. The memory device of claim 7, wherein N equals 8.

9. The memory device of claim 1, further comprising:
an additional configuration line, wherein said additional configuration line has a signal state which enables or disable a read clock delay lock loop of said memory device.

10. A memory module comprising:
a plurality of memory devices; and
a register for providing configuration information to said plurality of memory devices;
wherein each of said memory device further comprises,
a memory array;
a control circuit coupled to the memory array;
at least one configuration line coupled to said register and said control circuit;
wherein said control circuit operates the memory device at a device read latency equal to a minimum read latency of said memory device plus a number of clock cycles, said number being based upon a state of a signal asserted on said at least one configuration line.

11. The memory module of claim 10, wherein the control circuit, responsive to a command issued by an external memory controller, outputs to said memory controller a calibration pattern as read data.

12. The memory module of claim 11, wherein said calibration pattern includes at least two successive bits which have a different logic state.

13. The memory module of claim 12, wherein said calibration pattern has its first bit set to a binary 0 and all subsequent bits set to a binary 1.

14. The memory module of claim 12, wherein said calibration pattern has its first bit set to a binary 1 and all subsequent bits set to a binary 0.

15. The memory module of claim 10, wherein said at least one configuration line includes a plurality of configuration lines.

16. The memory module of claim 10, wherein said control circuit operates said memory device over a set of device read latencies, said set including N device read latencies ranging from the minimum device react latency to N−1 clock cycles greater than the minimum device read latency.

17. The memory module of claim 16, wherein N equals 8.

18. The memory module of claim 10, further comprising:
an additional configuration line, wherein said additional configuration line has a signal state which enables or disable a read clock delay lock loop of said memory device.

19. A method of operating a memory device, the memory device having at least one configuration line, comprising:
operating the memory device at a device read latency equal to a minimum device read latency of said memory device plus a number of clock cycles, said number being based on a state of a signal asserted on at least one configuration line.

20. The method of claim 19, further comprising the step of:
responsive to a command from a memory controller, outputting a calibration pattern.

21. The method of claim 20, wherein said calibration pattern includes at least two successive bits which have a different logical state.

22. The method of claim 21, wherein said calibration pattern has its first bit set to a binary 0 and all subsequent bits set to a binary 1.

23. The method of claim 21, wherein said calibration pattern has its first bit set to a binary 1 and all subsequent bits set to a binary 0.

24. The method of claim 19, wherein said at least one configuration line includes a plurality of configuration lines.

25. A computer system comprising:
a processor;
a memory controller coupled to the processor;
at least one memory module coupled to the memory controller, each of said memory modules comprising a plurality of memory devices;
wherein each of said memory devices further comprises,
a memory array;
a control circuit coupled to the memory array;
at least one configuration line coupled to said control circuit;
wherein said control circuit operates the memory device at a device read latency equal to a minimum device read latency of said memory device plus a number of clock cycles, said number being based upon a state of a signal asserted on said at least one configuration line.

26. The computer system of claim 25, wherein the control circuit, responsive to a command issued by an external memory controller, outputs a calibration pattern.

27. The computer system of claim 26, wherein said calibration pattern includes at least two successive bits which have a different logical state.

28. The computer system of claim 27, wherein said calibration pattern has its first bit set to a binary 0 and all subsequent bits set to a binary 1.

29. The computer system of claim 27, wherein said calibration pattern has its first bit set to a binary 1 and all subsequent bits set to a binary 0.

30. The computer system of claim 25, wherein said at least one configuration line includes a plurality of configuration lines.

31. The computer system of claim 25, wherein said control circuit operates said memory device over a set of device read latencies, said set including N device read latencies ranging from the minimum device read latency to a number of clock cycles equal to the device minimum read latency plus N−1 clock cycles.

32. The computer system of claim 31, wherein N equals 8.

33. A method of operating a memory system, the memory system having at a plurality of memory devices and a memory controller, comprising the steps of:
responsive to a command from the memory controller, setting each of the plurality of memory devices to operate at its minimum device read latency;

measuring the system read latency for each of the plurality of memory devices at said memory controller;

determining a maximum system read latency at said memory controller, said maximum system read latency being equal to the maximum of the plurality of system read latencies;

calculating a plurality of offsets at said memory controller, each of said plurality of offsets being associated with a corresponding one of the plurality of memory devices and being equal to the difference between the maximum system read latency and the system read latency of the corresponding one of the plurality of memory devices; and setting each of the plurality of memory devices to operate at an increased device read latency by the memory controller, wherein the amount of increased device read latency is equal to the offset associated with that one of the plurality of memory devices.

34. The method of claim 33, wherein the step of measuring further comprises:

sending a calibration pattern from each memory device in response to a command from said memory controller.

35. The method of claim 34, wherein said calibration pattern includes at least two successive bits which have a different logical state.

36. The method of claim 35, wherein said calibration pattern has its first bit set to a binary 0 and all subsequent bits set to a binary 1.

37. The method of claim 36, wherein said calibration pattern has its first bit set to a binary 1 and all subsequent bits set to a binary 0.

* * * * *

UNITED STATES PATENT AND TRADEMARK OFFICE
CERTIFICATE OF CORRECTION

PATENT NO. : 6,658,523 B2
DATED : December 2, 2003
INVENTOR(S) : Jeffery W. Janzen et al.

It is certified that error appears in the above-identified patent and that said Letters Patent is hereby corrected as shown below:

<u>Column 5,</u>
Line 40, reads "operate a" should read -- operate --.

<u>Column 7,</u>
Lines 23 and 66, reads "disable" should read -- disables --.
Line 36, reads "minimum" should read -- minimum device --.

Signed and Sealed this

Thirteenth Day of April, 2004

JON W. DUDAS
*Acting Director of the United States Patent and Trademark Office*